United States Patent
Madore et al.

[11] Patent Number: 6,144,873
[45] Date of Patent: Nov. 7, 2000

[54] METHOD OF EFFICIENT DATA ENCODING IN DYNAMIC MAGNETIC RESONANCE IMAGING

[75] Inventors: Bruno Madore, Redwood City; Gary H. Glover, Stanford; Norbert J. Pelc, Los Altos, all of Calif.

[73] Assignee: Board of Trustees of The Leland Stanford Junior University, Palo Alto, Calif.

[21] Appl. No.: 09/062,295

[22] Filed: Apr. 17, 1998

[51] Int. Cl.$^7$ ..................................................... A61B 5/055
[52] U.S. Cl. ............................................. 600/410; 324/309
[58] Field of Search ................................... 600/410, 413; 324/306, 309, 307

[56] References Cited

U.S. PATENT DOCUMENTS

| | | |
|---|---|---|
| 4,521,733 | 6/1985 | Bottomley et al. . |
| 4,701,706 | 10/1987 | Haacke . |
| 4,985,677 | 1/1991 | Pauly ........................................ 324/309 |
| 5,296,808 | 3/1994 | Macovski ................................. 324/309 |
| 5,529,068 | 6/1996 | Hoenninger, III et al. ........... 128/653.2 |
| 5,653,233 | 8/1997 | Pelc et al. .............................. 128/653.2 |
| 5,697,370 | 12/1997 | Pelc et al. .............................. 128/653.2 |
| 5,830,143 | 11/1998 | Mistretta et al. ........................ 600/420 |
| 5,873,825 | 2/1999 | Mistretta et al. ........................ 600/410 |
| 5,910,728 | 6/1999 | Sodickson ............................... 324/309 |
| 5,966,169 | 10/1999 | Bullis ......................................... 348/81 |
| 6,073,041 | 6/2000 | Hu et al. . |

OTHER PUBLICATIONS

Xiaoping Hu and Todd Parrish, "Reduction of Field of View for Dynamic Imaging," MRM 31 (1994) pp. 691–684).

Primary Examiner—Marvin M. Lateef
Assistant Examiner—Shawna J. Shaw
Attorney, Agent, or Firm—Townsend and Townsend and Crew LLP; Henry K. Woodward

[57] ABSTRACT

MRI is used to monitor the time behavior or an organ of interest. Images of such organ may change in time due to physiological motion, and/or due to contrast-agent accumulation. Dynamic applications generally involve acquiring data in a k-t space, which contains both temporal and spatial information. In some dynamic applications, the t axis of the k-t space is not densely filled with information. A method is introduced which can transfer information from the k axes to the t axis, allowing a denser, smaller k-t space to be acquired, and leading to significant reductions in the acquisition time of the temporal frames. Results are presented for cardiac imaging and functional MRI (fMRI). In the case of cardiac imaging, the present method is shown to reduce the data requirement by nearly a factor two. In the case of fMRI, reductions by as much as a factor six can be obtained. The behavior of the method is assessed by comparing the results to data obtained in a conventional way. Of course, the reductions in imaging time lead to the expected reductions in SNR. The present method can be used to significantly reduce the acquisition time of the individual temporal frames in certain dynamic studies. This can be used, for example, to increase the temporal and/or spatial resolution, increase the spatial coverage, decrease the total imaging time, or alter sequence parameters (e.g., TR and TE) and thereby alter contrast, depending on the circumstances.

14 Claims, 10 Drawing Sheets

*FIG. 1A*
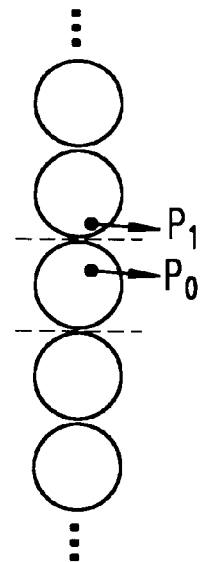
*FIG. 1B*  *FIG. 1C*
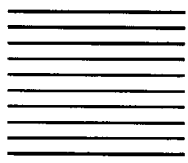
*FIG. 2A*
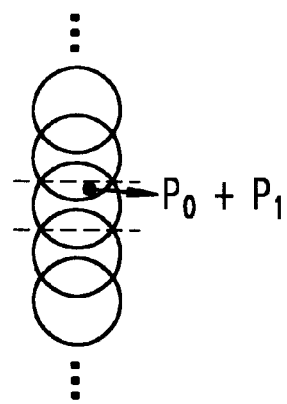
*FIG. 2B*  *FIG. 2C*

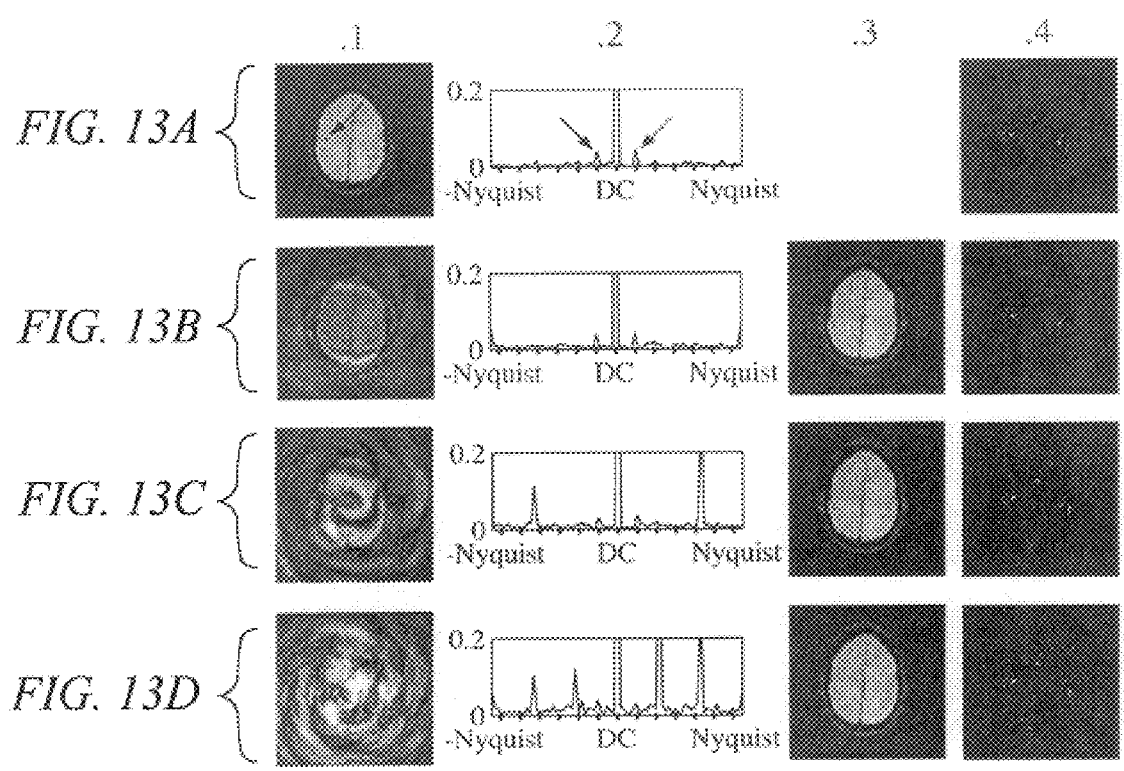

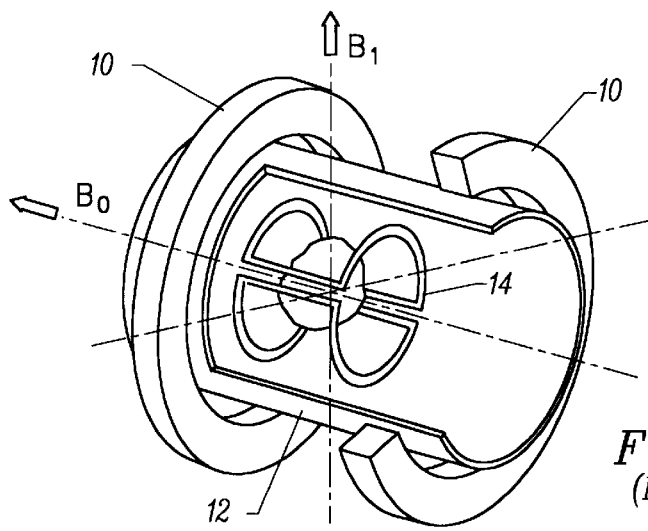
FIG. 15A
(PRIOR ART)
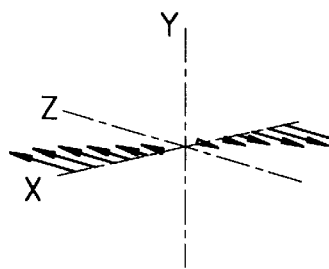
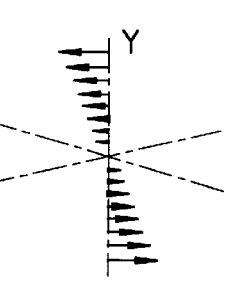
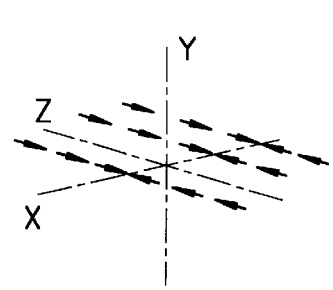
FIG. 15B   FIG. 15C   FIG. 15D
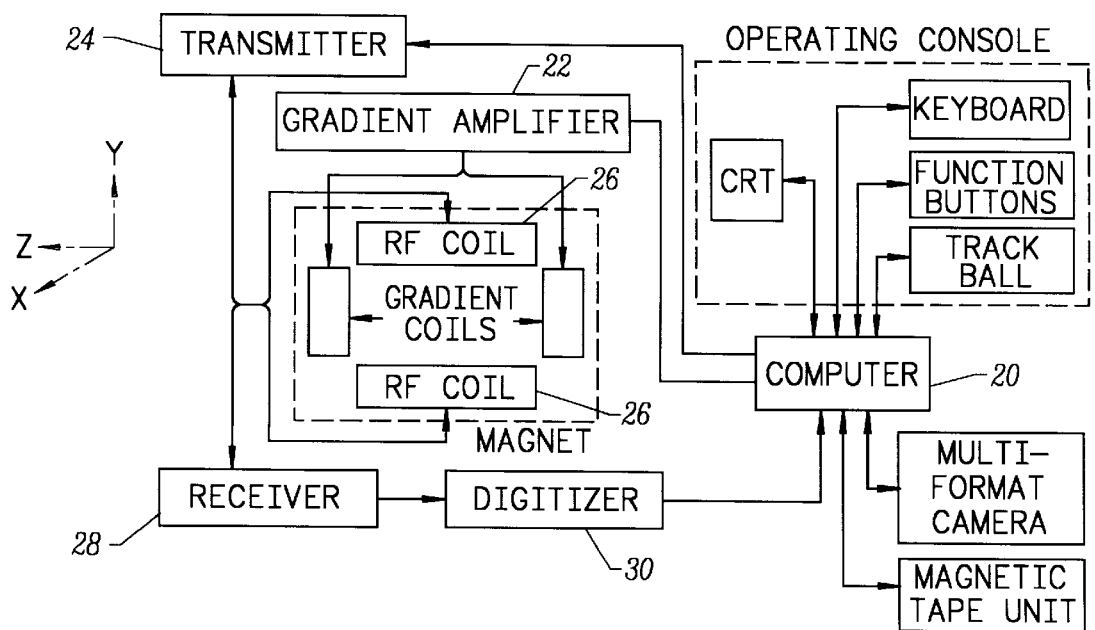
FIG. 16
(PRIOR ART)

METHOD OF EFFICIENT DATA ENCODING IN DYNAMIC MAGNETIC RESONANCE IMAGING

The U.S. government has rights in the claimed invention pursuant to NIH Contract No. P41 RR09784-04 with Stanford University, assignee.

BACKGROUND OF THE INVENTION

This invention relates generally to magnetic resonance imaging (MRI), and more particularly the invention relates to a more efficient method of data encoding in dynamic resonance imaging through the transfer of k-space data to the time domain thereby acquiring a more dense k-t space with attendant reduction in acquisition time.

Magnetic resonance imaging (MRI) is a nondestructive method for the analysis of materials and represents a new approach to medical imaging. It is generally noninvasive and does not involve ionizing radiation. In very general terms, nuclear magnetic moments are excited using magnetic fields which rotate at specific frequencies proportional to the local static magnetic field. The radio frequency signals resulting from the precession of excited spins are received using pickup coils. By manipulating the magnetic fields, an array of signals is provided representing different regions of the volume. These are combined to produce a volumetric image of the nuclear spin distribution of the body.

FIG. 15A is a perspective view, partially in section, illustrating coil apparatus in MR imaging system and FIGS. 15B–15D illustrate field gradients which can be produced in the apparatus of FIG. 15A. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the Z axis within in the saddle coil. In FIG. 15B an X gradient field is shown which is parallel to the static field $B_0$ and varies linearly with distance along the X axis but does not vary with distance along the Y or Z axes. FIGS. 15C and 15D are similar representations of the Y gradient and Z gradient fields, respectively.

FIG. 16 is a functional block diagram of conventional imaging apparatus. A computer 20 was programmed to control the operation of the MRI apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed through the receiver 28 and then through digitizer 30 for processing by computer 20. For the dynamic imaging techniques of the present invention, physiological monitoring and triggering equipment (not shown) may be needed, as known by one skilled in the art.

The signal collected in magnetic resonance imaging (MRI) is a sample of the Fourier transform of the object being imaged. MRI is used in several applications to monitor the time behavior of an organ of interest. In such dynamic applications the signal collected belongs to a Fourier space augmented with a time axis, known as a k-t space. When imaging a dynamic object, an ideal situation would consist in completely filling the corresponding k-t space matrix, thereby providing all the desired spatial information at any moment in the imaging period. However, the imaging process is often too slow to acquire all the spatial and temporal information with the needed resolution. Various methods have been developed to increase the resolution of an acquired data set. The simplest approach is to interpolate the data spatially (e.g. zero filling) or temporally (e.g. data sharing), resulting in a smoothed representation of the actual object. A second approach consists in using a limited number of high resolution images to model the spatial variations of the imaged object (e.g. keyhole, 'reduced-encoding MR imaging with generalized-series reconstruction', 'singular value decomposition'). Time frames can be acquired in rapid succession (high temporal resolution) as the model requires only a small amount of spatial information to generate a full FOV time frame. However, only the dynamic changes having a spatial distribution expected by the model are depicted accurately in the resulting images. Another approach consists in assuming the dynamic changes to be contained within only part of the FOV. The prior knowledge that some regions of the object are static is used to reduce the amount of information that needs to be acquired.

Unlike the methods above, the present invention does not rely on interpolation, modeling or assuming part of the FOV to be static in order to increase resolution. Instead, the invention provides new flexibility in the way spatio-temporal information is encoded with MRI, such that one can avoid some inefficiencies present in conventional acquisitions.

SUMMARY OF THE INVENTION

The raw data acquired in MRI are samples, in k-space, of the Fourier transform of the object. The location in k-space is controlled by the gradients, as is well known in the art.

Dynamic MRI generally involves the acquisition of data in a k-t space which contains both temporal and spatial information. In some dynamic MRI applications, the time or t axis of k-t space is not densely filled. The present invention transfers information from the k axes (kx, ky) to the t axis, thereby acquiring a smaller, denser k-t space with reductions in data acquisition time of the temporal image frames.

The invention utilizes a smaller acquired field-of-view (FOV) which diminishes the spatial data acquired along the k axes of the k-t space. As is known, the reduced FOV results in aliasing of image data whereby spatially distinct points within the object are overlapped at a same spatial position in the images. However, a Fourier transform through time of the acquired data can separate or resolve the various data components.

The reorganization of the k-t space can be translated into a reduction of the total acquisition time, an improvement of the spatial and temporal resolution, or an increase in the spatial coverage.

The invention and objects and features thereof will be more readily apparent from the following detailed description and appended claims when taken within the drawings.

BRIEF DESCRIPTION OF THE DRAWINGS

FIGS. 1(a)–1(c) are graphical representations of a k-space sampling function, a point spread function, and the resulting image where two points are indicated.

FIGS. 2(a)–2(c) are similar to FIGS. 1(a)–1(c) with a reduction in lines of the sampling function and resulting aliasing.

FIGS. 13(a)–13(d) illustrate data and images in a functional MRI study.

FIGS. 15A–15D illustrate the arrangement of conventional MRI apparatus and magnetic fields generated therein.

FIG. 16 is a functional block diagram of MRI apparatus.

DETAILED DESCRIPTION OF THE ILLUSTRATIVE EMBODIMENTS

Figure 3A:
FIGS. 3(a)–3(c) illustrate the sampling function of FIGS. 2(a)–2(c) shifted along the phase encoding direction for acquiring data at a second time point.

Several applications of MRI involve acquiring a time series of images in order to resolve the variations undergone by the imaged object. These dynamic studies include cardiac imaging, fMRI, time-resolved angiography, and contrast agent uptake studies. When dynamic objects are imaged, an ideal situation would consist in completely filling their k-t space, thereby providing all the desired spatial information at any moment in the imaging time period. Since the imaging process is often too slow to acquire all the spatial and temporal information with the needed resolution, various methods have been developed that acquire only a part of the desired k-t space, the rest being obtained through some model or approximation. Such methods include keyhole imaging, 'reduced-encoding MR imaging with generalized-series reconstruction (RIGR)', data sharing, zero filling, reduced FOV methods which assume that much of the imaged object (with the exception of a dynamic region) is static or undergoing bulk translations, and non-Fourier approaches like 'singular value decomposition (SVD)' and wavelet methods (with non-Fourier approaches the acquired data does not belong to the k-t space but is used in the calculation of a full k-t space).

These methods and the present invention share the same goal: to reduce the amount of data that needs to be acquired for a given spatial and temporal resolution. However, such a reduction is achieved by the invention without using any data modeling and without requiring part of the FOV to be static.

The invention which can be described as 'UNaliasing by Fourier-encoding the Overlaps using the temporaL Dimension' (herein referred to as UNFOLD) is a new, flexible way of encoding spatio-temporal information with MRI. Inefficiencies in some dynamic applications are identified, and the extra flexibility introduced here makes it possible to partially avoid such inefficiencies. The reductions in data requirements (up to nearly a factor two with cardiac imaging, and as much as a factor six with fMRI) does not come from a model that fills in the missing data; instead, it comes from a more efficient encoding of the desired information.

UNFOLD involves, in a first step, a reduction of the dynamic field-of-view (FOV). This FOV reduction diminishes the amount of spatial information acquired along the k axes of the k-t space. Due to aliasing, spatially distinct points within the object are overlapped at a same spatial position in the images. UNFOLD then uses time to label the overlapped components, such that a Fourier transform through time can resolve the various components. This use of the time axis to encode some spatial information introduces a certain freedom in deciding 'what should be encoded where' in k-t space. In some applications, k-t space can be thought of as a partially filled box, having free spaces in hard-to-reach areas. For example, in cardiac imaging the most dynamic changes are confined to only a part of the FOV, while in fMRI signal variations are expected only at the temporal frequencies having a correlation with the paradigm. In such cases, the ability to transfer some information from a k axis to the t axis may be sufficient to build a tighter, denser and smaller k-t space allowing the acquisition of a lower number of data points. As described herein, such reformatting of the k-t space may lead to significant reductions in data requirements.

The theory behind UNFOLD is presented using the following structure. First, it is shown that time can be used to label aliased spatial components. Different imaging methods can give rise to very different types of aliasing. For this reason, the theory is first presented in the context of Cartesian FT imaging methods, where aliasing consists of a simple overlap of what should be distinct spatial points. Then, a more general approach is presented where the spatial aliasing may be of a more complicated nature. Specific applications such as cardiac imaging (Subsection 2.1 of the Theory section) and fMRI are then considered.

UNFOLD provides a way of discriminating between spatially aliased and non-aliased components in images. Accordingly, two or more points can be overlapped through aliasing in a deliberate way, and separated afterward using the method described below. In some circumstances, described such a scheme leads to efficient ways of encoding dynamic information, diminishing significantly the amount of data that is required to achieve a given spatial and temporal resolution.

Described now is how to label, and then separate, aliased and non-aliased components using time modifications, first for data sampled on a Cartesian grid (FT imaging methods).

When an object is imaged, only certain points in k-space have their value actually measured. The "sampling function" represents how k-space is sampled by a given imaging method: it is equal to one at the $\vec{k}$ locations that are sampled, and zero elsewhere. The relationship between the object, its image, and the sampling function is given by:

$$I(\vec{r})=F(S(\vec{k}))*O(\vec{r})=PSF(\vec{r})*O(\vec{r}) \quad (1)$$

where $\vec{r}$ and $\vec{k}$ are position-vectors in, respectively, the object domain and k-space, 'F' represents a Fourier transform (FT), '*' represents a convolution, $S(\vec{k})$ is the sampling function, $O(\vec{r})$ is the object, $I(\vec{r})$ is its image, and $PSF(\vec{r})$ is the point-spread function, given by $F(S(\vec{k}))$ (for simplicity, other contributions to the PSF, like $T_2$ and $T_2^*$, are left out). FIG. 1a depicts a sampling function $S(k_x, k_y)$ as used by 2D DFT imaging methods. With DFT methods, k-space data is sampled directly onto a Cartesian grid. (The $k_x$ lines in FIG. 1a are depicted simply as continuous lines instead of a series of points for simplicity and because the sampling along $k_x$ is assumed sufficient to avoid aliasing in the x direction.) The PSF associated with Cartesian sampling, which is the FT of FIG. 1a, is shown in FIG. 1b (its peaks are numbered for future reference). Through the convolution in Eq. 1, the multiple peaks of the PSF replicate the object O(x,y) in the y direction. The result is shown in FIG. 1c. The two dashed lines in FIG. 1c give the extent of $FOV_y$, the FOV in the y direction. These lines are located half way between the $0^{th}$ and the $\pm 1^{st}$ peak of the PSF shown in FIG. 1b. If the imaged object is contained within these two lines, then no aliasing occurs.

FIG. 2 shows what happens if the number of lines in the sampling function is reduced by a factor two, while imaging the same object and spatial bandwidth as in FIG. 1. This change in the sampling function reduces $FOV_y$ by a factor two, resulting in the well-known problems of aliasing and overlap of aliased and non-aliased components [37, 38], as shown in FIG. 2c. The points $P_0$ and $P_1$, which were separated in FIG. 1c, are now overlapped into a single image point in FIG. 2c.

Figures 3B, 3C:
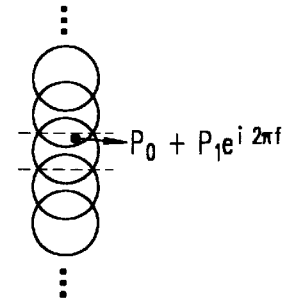

The idea behind UNFOLD is introduced in FIG. 3. UNFOLD involves shifting the sampling function in the phase-encoding direction. From the shift theorem [39], a shift of $S(\vec{k})$ by a fraction f of a line (as depicted in FIG. 3a) results into a linear phase shift being applied to $PSF(\vec{r})$, (as depicted in FIG. 3b), altering the phase of all but the central peak. Through the convolution in Eq. 1, the phase of each PSF peak is passed to the corresponding replica of the object as shown in FIG. 3c. For example, the point $P_0$ remains unchanged by the shift (because it originates from the central peak of the PSF) but the point $P_1$ is phase shifted by an angle $2\pi f$ (because it originates from the first peak of the PSF). In a dynamic study, where several images of an object are acquired, the shift in the sampling function can be varied from image to image. As explained in the following paragraphs, such a time-varying shift in the sampling function can be used to "label", and then resolve, the various aliased components that are overlapped, by modulating their phase through time in a controlled way.

Figure 4A:
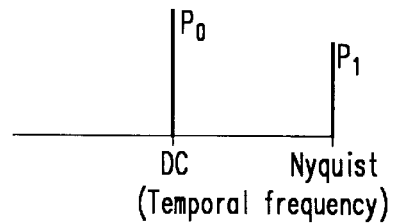
FIGS. 4(a), 4(b) illustrate data received from a non-aliased object point, $P_0$, and an aliased object point, $P_1$.

Consider the following example. For a moment, assume that both $P_0$ and $P_1$ are constant in time. A time series of images is acquired, where every odd image in the series is obtained using a sampling function shifted by half a line (f=0.5) compared to the sampling function used for the even images. As a result, the value of the image point where $P_0$ and $P_1$ overlap oscillates between $P_0+P_1$ and $P_0+P_1 e^{i\pi}=P_0-P_1$, with a period of two images. FIG. 4a shows the temporal frequency spectrum (the FT in the time direction) of this image point. The spectrum contains a component oscillating at the Nyquist frequency (the point $P_1$) and a DC component (the point $P_0$). Notice that $P_0$ and $P_1$ in FIG. 4a are no longer overlapped; they have been Fourier encoded to different locations in the temporal frequency domain, and they can be discriminated from each other in FIG. 4a as surely as in FIG. 1c (where $P_0$ and $P_1$ are Fourier encoded to different locations in the spatial domain).

Figure 4B:
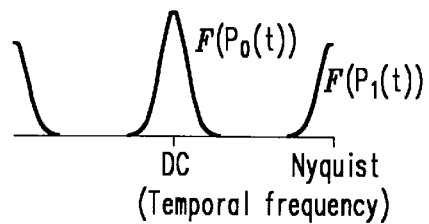

In FIG. 4b, the assumption that $P_0$ and $P_1$ are constant in time is removed. The spectrum associated with the point $P_0(t)$, $F(P_0(t))$, now contains a range of frequencies instead of a single (DC) component. The more "dynamic" a point is, the wider is the frequency range required to describe the time variations at this point. The same can be said of $P_1(t)$ and its spectrum $F(P_1(t))$. As in FIG. 4a, the spectrum associated with $P_1(t)$ is shifted by half the temporal bandwidth and centered at the Nyquist frequency. This is due to the shifts applied to the sampling function, which change the sign of $P_1(t)$ every second frame. Since the spectra from $P_0(t)$ and $P_1(t)$ are separated in FIG. 4b, the time dependence of either point can be obtained by filtering out (i.e. removing) the spectrum associated with the other point and applying a Fourier transform to the result.

The example presented above can be further generalized. Imagine n points overlapped into a single voxel through spatial aliasing. These n points are referred to as $P_j$, where j is the order of the PSF peak from which a point originates. The value of the resulting composite point is given by:

$$P(t) = \sum_{j=-floor\left(\frac{n-1}{2}\right)}^{floor\left(\frac{n}{2}\right)} P_j(t) \cdot e^{i2\pi f(t)j} \quad (2)$$

where floor is a function that rounds a real number to the nearest lower integer and f(t) is the k-space shift of the sampling function $S(\vec{k})$ employed at time t. A useful special case to consider is choosing f(t) which is a linear function of time:

$$f(t) = \frac{t}{n} \quad (3)$$

where the time variable t is actually the image number in a time series. Substituting Eq. 3 into Eq. 2 yields:

$$P(t) = \sum_{j=-floor\left(\frac{n-1}{2}\right)}^{floor\left(\frac{n}{2}\right)} P_j(t) \cdot e^{\frac{i2\pi tj}{n}} \quad (4)$$

The complex exponential in Eq. 4 is in fact a Fourier basis function. The temporal frequency spectrum F(P(t)) is made of n peaks, uniformly spaced across the bandwidth. Each peak is associated with one of the n spatially overlapped points. The example shown in FIG. 4b represents the case n=2. (It can be noted that n=2 in Eq. 3 leads to f being successively 0, 1/2, 1, 3/2, 2, . . . while in the example presented in FIG. 4, a pattern 0, 1/2, 0, 1/2, 0, . . . was described for f. The two patterns are equivalent, due to the cyclic nature of angles and of the complex exponential.)

As will be further discussed later on in this paper, a larger bandwidth may be required if, instead of one spectrum, n spectra were to be placed adjacent to each other in the bandwidth with a minimum of overlap between them. Clearly, UNFOLD becomes useless if the only way of fitting n spectra without overlap involves increasing the bandwidth by a factor n. The whole idea behind this work is that in certain applications, forcing two or more points to share the same temporal bandwidth leads to more efficient ways of encoding information. Images obtained for two such cases, (cardiac imaging and fMRI), are presented hereinbelow.

We have shown that spatial points that are overlapped due to aliasing can be resolved by applying shifts to a Cartesian, DFT sampling function. As described in the next subsection, this method can also be used with non-Cartesian sampling trajectories.

Consider data sampled using an arbitrary trajectory and a time series of images acquired using an arbitrary sampling trajectory in k-space. The chosen trajectory is assumed to provide an adequate sampling for the desired spatial resolution and FOV. Instead of acquiring all the k-space samples for every time frame, only a fraction of the samples is collected (for example, this could mean acquiring only a fraction of all the $k_y$ lines in a Cartesian FT scan, or only a fraction of all the interleaves in a spiral [40] scan) This partial coverage of k-space gives rise to individual time frames that may appear corrupted by spatial aliasing. From one time frame to the next, a different set of k-space points is acquired, such that all the points of a full k-space matrix are collected in n time frames. The sampling functions used for the n frames are then used again, in a periodic way, for the acquisition of the subsequent images in the time series.

Suppose that an object, assumed for now to be static in time, is imaged using the scheme described above. A time series of seemingly corrupted images is generated, where the intensity at every image point is a periodic function of time with a period of n time frames. As stated previously, the sum of the sampling functions used for n consecutive time frames gives the full sampling function (which has an adequate k-space sampling for the desired spatial resolution and FOV). Using the linearity of the Fourier transform, the sum of n consecutive time frames is a non-corrupted image. In other words, every voxel in every time frame can be thought of as consisting of a correct value, plus an error component coming from the insufficient sampling of k-space. However, this error term as a function of time has a zero temporal DC component. Indeed, when the time frames are averaged along the time axis (i.e. when the DC component is calculated), the result is a non-aliased image.

Figure 5A:
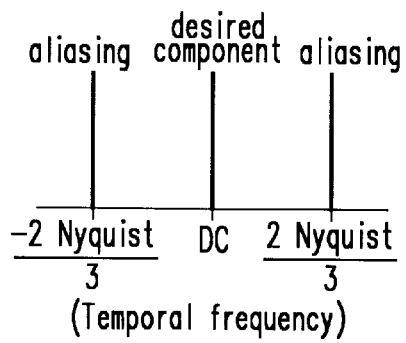
FIGS. 5(a), 5(b) illustrate the Fourier transform of time-varying intensity at a given voxel.
Figure 5B:
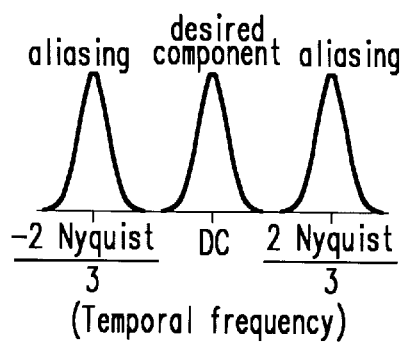

The Fourier transform of the time-varying intensity at a given voxel has no more than n non-zero frequency components, including a DC component. This derives from the fact that the voxel intensity varies in a periodic way, with a period of n time frames. An example is given in FIG. 5a for n=3, where three non-zero frequency components can be found uniformly spaced in the temporal frequency domain. The whole UNFOLD approach is based on the fact that using the proposed encoding scheme, the desired component and the aliased components are encoded at different locations in the temporal frequency domain. Accordingly, the desired (non-aliased) component can be recovered. As shown in FIG. 5b, if the imaged object is a dynamic one, a range of temporal frequencies are required to describe the aliased and the non-aliased components.

The situation described above is a special case of the method described in the present subsection. For this special case, the sampling function in the spatial frequency domain is Cartesian, and the full sampling function is divided into n partial ones by selecting a $k_y$ line every n lines. The partial sampling functions are simple translations of one another. This simplicity gives rise to especially convenient behavior in the spatial domain, as the aliasing simply consists of an overlap of n spatial points at every image point. In more general cases, the aliased components contained in the non-DC peaks in FIG. 5 may come from a large number of spatial points. As will be seen in the following sections, the cardiac application may require UNFOLD to have a simple spatial behavior, but the fMRI application does not have such a requirement. Accordingly, a Cartesian imaging sequence was used to acquire the cardiac results, while a non-Cartesian one (spiral imaging) was used to acquire the fMRI results.

The UNFOLD method makes it possible to use the time axis as a means of encoding some spatial information. In a case where every spatial point in the FOV would need a full temporal bandwidth to be adequately described, UNFOLD would not provide any advantage. However, if some spatial points do not require the full bandwidth, then it may be possible to efficiently "stack" or interleave more than one spatial point in what would otherwise be the full bandwidth of a single image point. Subsectons 2.1 and 2.2 show, respectively, how such an encoding scheme can significantly reduce the data requirements for a given spatial and temporal resolution, in cases like cardiac triggered imaging and fMRI.

In general, the signal at every point in the FOV could vary as a function of time, e.g. due to cardiac of respiratory motions or the transit of a contrast agent. However, the signal in some regions could be much more variable than that in others. For example, in cardiac gated imaging, proper characterization of the signal in the heart could require much higher temporal bandwidth than needed for the chest wall. Some methods presented in the past are successful when the imaged object is composed of a portion which is static (or moving as a bulk [32]), and another portion which is dynamic [30–32]. However, these methods are not appropriate for a situation where the anatomy outside the dynamic ROI is almost static, but not static. UNFOLD has the ability to handle a situation such as the imaging of a dynamic heart surrounded by less dynamic (but not static) material.

Figure 6A:
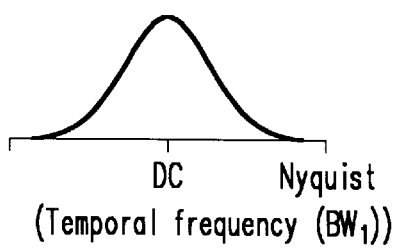
FIGS. 6(a)–6(c) illustrate temporal frequency spectra of pixels inside and outside of an imaged heart.
Figure 6B:
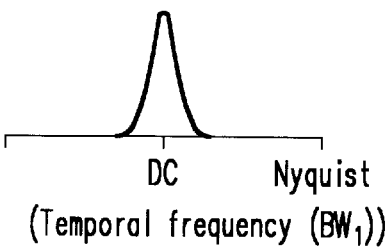
Figure 6C:
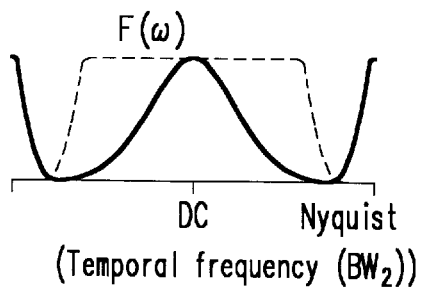

Because its complex intensity may vary rapidly in time, the temporal frequency spectrum of a pixel in the highly dynamic portion can be relatively wide, as depicted in FIG. 6a. On the other hand, pixels outside the heart that are not as dynamic are expected to have a narrower temporal frequency spectrum, as depicted in FIG. 6b. With $n_{pix}$ being the number of pixels in the full FOV and $BW_1$ being the bandwidth as shown in FIG. 6a and b, a dynamic study of the heart would normally involve acquiring $n_{pix}$ time spectra each having a bandwidth $BW_1$. FIG. 6c depicts the alternative solution offered by the present method. Each wide (highly dynamic) spectrum, as the one shown in FIG. 6a, is coupled with a narrower (less dynamic) spectrum, as the one in FIG. 6b. Using the method described above, they are forced to share the same bandwidth (i.e. the same image voxel). A bandwidth $BW_2$, slightly larger than $BW_1$, can be used to accommodate both spectra. Since two object locations are coupled in each spectrum, only $n_{pix}/2$ bandwidths of width $BW_2$ need to be collected, leading to a diminution in the amount of data which needs to be acquired by the factor $f_{data}$:

$$f_{data} = \frac{2 \cdot BW_1}{BW_2} \quad (5)$$

These bandwidths $BW_1$ and $BW_2$ refer to the variation in the signal at a single image point and should not be confused with the data acquisition bandwidth used during the measurement of a single free induction decay (FID) or echo.

The situation where two wide spectra like the one in FIG. 6a are coupled in the same bandwidth must be avoided, and this is done in the following way. In the case where all the most dynamic points are localized within a certain area of the object (like the region of the heart), an acquisition FOV is selected which is at least as large as the dynamic region. Although the object itself may be larger than the acquisition FOV, having the 'dynamic' region no bigger than the acquisition FOV guarantees that no aliasing from a 'dynamic' point can overlap onto another 'dynamic' point.

The two spectra sharing the same bandwidth in FIG. 6c can be separated from each other using a filter F(w), like the one shown with a dashed line in FIG. 6c. Because the FOV (and scan time) in this case were reduced by a factor two, each resulting image could be expected to have an SNR that is reduced by a factor $\sqrt{2}$ (with respect to a study having the same spatial resolution and a full FOV). However, the filter F(w) used to separate the two spectra also affects SNR, since it removes the noise contained in part of the $BW_2$ bandwidth. The filtering increases the SNR of the individual time frames by a factor that depends on the filter. As a result, the present method affects the SNR by a factor $f_{SNR}$ given by:

$$f_{SNR} = \sqrt{\frac{BW_2}{2\int_{BW_2} F^2(\omega)d\omega}} \quad (6)$$

Note that $f_{SNR}$ does not include the impact on SNR that may have been needed to increase the temporal bandwidth from $BW_1$ to $BW_2$ (e.g. any shortening of TR). To preserve the peak at the Nyquist frequency and suppress the one at DC, (instead of the inverse), a filter (1−F(w)) is used instead of F(w). Since the filter (1−F(w)) is narrower than F(w), it removes more noise and as a result, in any single image, the SNR will be higher in the less dynamic region than in the more dynamic one. This is exactly as was observed and explained in [30] for the case where the less dynamic region is fully static.

In summary, UNFOLD decreases the data requirements by avoiding the acquisition of mostly empty spectra like the one in FIG. 6b. Through the coupling of spatial points, information is more densely packed into the acquired spectra, as depicted in FIG. 6c. If one of the two peaks is narrow, the amount of information to acquire goes down by nearly a factor two ($BW_2 \approx BW_1$ in Eq. 5) and accordingly, the SNR goes down by nearly $\sqrt{2}$ in the highly dynamic part of the FOV (a filter equal to one over nearly the whole $BW_2$ bandwidth gives $f_{SNR} \approx 1/\sqrt{2}$ in Eq. 6). If one of the peaks is so narrow that it can be considered a delta function, the present method becomes completely equivalent to [30] with the same time savings and SNR properties. Although this subsection focuses on the example of cardiac imaging, the present method could be applied to other time series of images where highly dynamic changes are localized within only part of the imaged object. In the next section, another type of dynamic study is considered. It is shown that the special nature of the dynamic changes encountered in fMRI make it especially suited for the UNFOLD method.

Figure 7A:
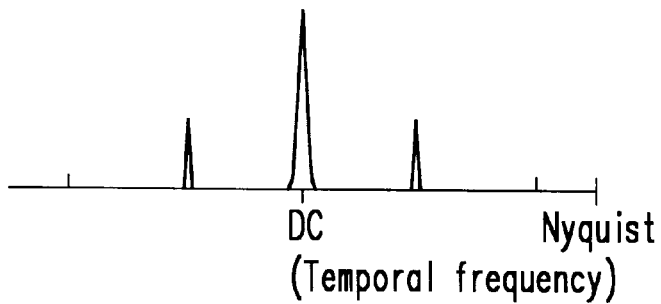
FIGS. 7(a)–7(c) illustrate temporal variations of pixels in a functional MRI study.
Figure 7B:
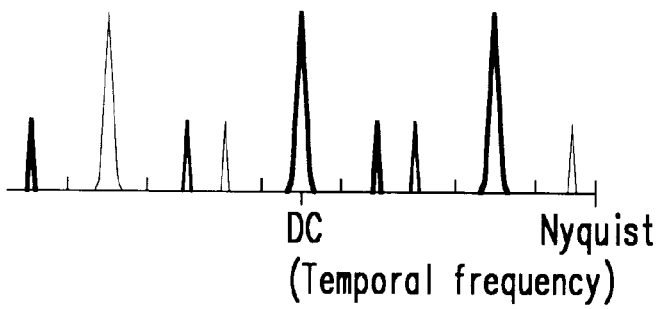

The temporal variations in fMRI have very special characteristics: they are periodic with a known frequency (the frequency of the paradigm). Consider one spatial point in an fMRI study where $n_p$ 'on/off' paradigm cycles are imaged with a time resolution of $n_t$ time points per paradigm cycle. The resulting temporal frequency spectrum for this spatial point is depicted in FIG. 7a: $n_t$ peaks separated by $n_p$ frequency points. If the signal from an object point is perfectly periodic, repeating itself exactly every $n_t$ time points, its spectrum would have only $n_t$ delta functions separated by $1/(n_t T)$ Hz where T is the time between images (units of seconds). It is assumed here that $n_t$ multiples of the fundamental frequency $1/(n_t T)$ are sufficient to characterize the signal variations. If the signal is not perfectly periodic, each delta function broadens, where the width of the peaks is related to the variation in the response during the study. Notice the empty areas between the peaks in FIG. 7a which appear if the bandwidth of the variation in fMRI signal from cycle to cycle is narrow compared to $1/(n_t T)$. Time is spent acquiring these empty areas which contain only frequencies having no correlation with the periodic paradigm. Using the method introduced in the first part of the Theory section, two or more spectra can be forced to share the same bandwidth, as depicted in FIG. 7b. If n spectra are stored in the same bandwidth, the amount of data required to achieve a given spatial and temporal resolution is reduced by a factor n. The next paragraphs explore more carefully how spectra like the one in FIG. 7a can be interleaved, in order to use more efficiently the bandwidth available.

Figure 7C:
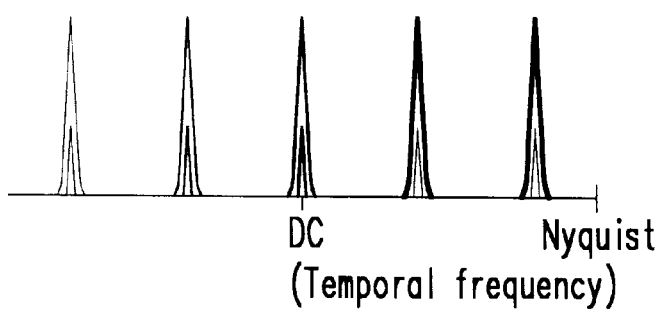

The total number of points in the temporal frequency domain is $n_p n_t$. The goal is to use these points to store as many spectra as possible, without overlap. As explained above, the individual peaks in a spectrum may have some width (Δ points), and cannot in general be considered as delta functions. Since there are $n_p$ points between adjacent peaks, no more than $n_p/\Delta$ spectra can be interleaved. The efficiency of the encoding can be maximized by choosing $n_p$ to be a multiple of Δ, and a number of interleaved spectra $n = n_p/\Delta$. As n spectra are placed within the same bandwidth, poor combinations of n and $n_t$ would lead to an overlap of the spectra, as shown in FIG. 7c. The solution for avoiding such overlap is to have an $n_t$ which is not a multiple of n (or vice-versa, for the unlikely case where n would be larger than $n_t$). For example, the case n=3 and $n_t=5$ in FIG. 7b does not lead to overlap, unlike the case n=5 and $n_t=5$ in FIG. 7c. (Technically, with some extra complications, it would be possible to avoid an overlap like the one in FIG. 7c without changing the value of n and/or $n_t$, if a Cartesian imaging method is used. This would involve choosing an increment for f in FIG. 3a which is not 1/n of a line and as a result, the n spectra would not be uniformly spaced across the bandwidth. For the present work, we consider only the earlier, simpler case of n and $n_t$ such that one is not a multiple of the other.)

In summary, the present method allows one to encode some spatial information along the t axis of k-t space. If all the points in an object need a full bandwidth to be adequately represented, then such a transfer of information from the k to the t axis is useless. However, if an object contains points having a temporal frequency spectrum that fills only a small fraction of the available bandwidth (like the spectra in FIG. 6b and 7a), it might be advantageous to use the free parts of the spectra to encode information about other spatial points. As described below, the UNFOLD method is used to speed up cardiac triggered imaging as well as fMRI.

Figure 8A:
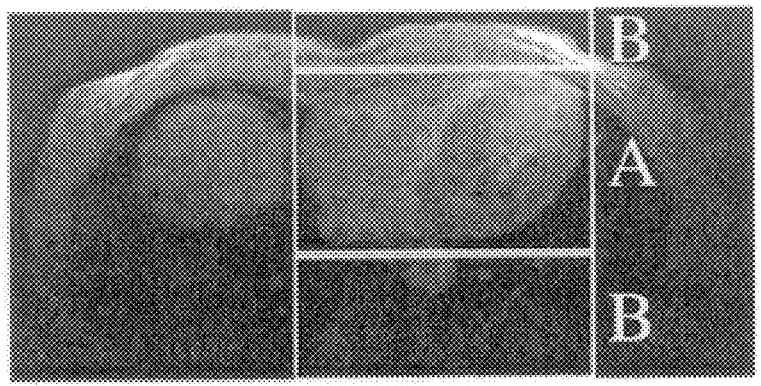
FIGS. 8(a)–8(d) are images in a cardiac study comparing an image acquired in accordance with the invention to a reference image.

A cardiac triggered study [1,2] was performed on a 1.5 T GE Signa imager (GE Medical Systems, Milwaukee, Wis.). A total of 16 cardiac phases was acquired; the $8^{th}$ phase is shown in FIG. 8a. Using only the even $k_y$ lines for the even time frames, and only the odd $k_y$ lines for the odd frames, a series of 16 time frames (which are corrupted by aliasing) was then reconstructed. These images were used as input to the UNFOLD method, which generated a series of images where the aliasing was unwrapped back to its original position to produce images as a function of time in a representative cardiac cycle. The $8^{th}$ time frame of the input and the output of UNFOLD are shown, respectively, in FIGS. 8b and c. The main goal of the present section is to evaluate the behavior of UNFOLD by comparing the resulting images (reconstructed using only one half of the acquired data, e.g. FIG. 8c), to the 'true' images (reconstructed using all the acquired data, e.g. FIG. 8a).

Figure 8B:
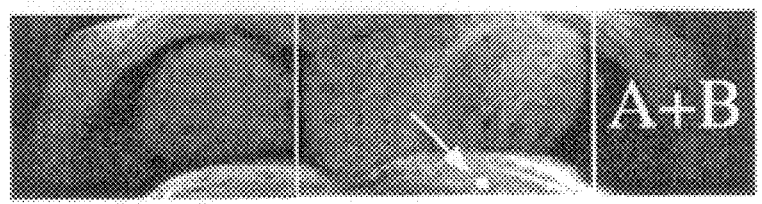
Figure 8C:
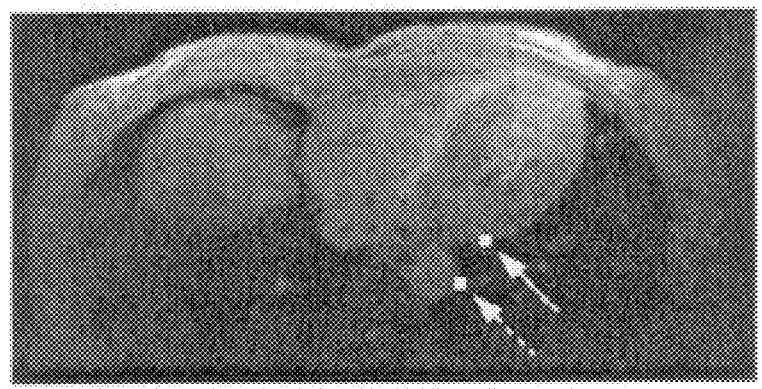
Figure 9A:
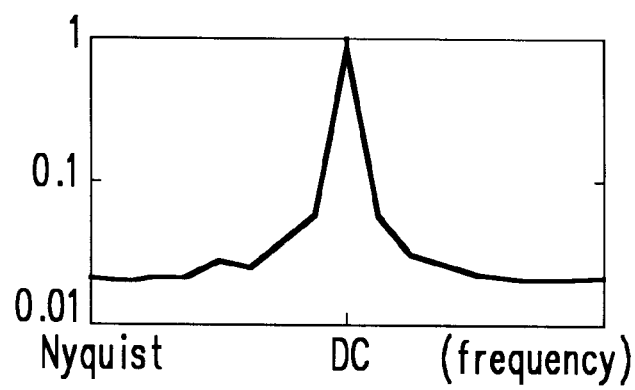
FIGS. 9(a)–9(c) illustrate temporal frequency spectra of pixels inside and outside of an imaged heart.
Figure 9B:
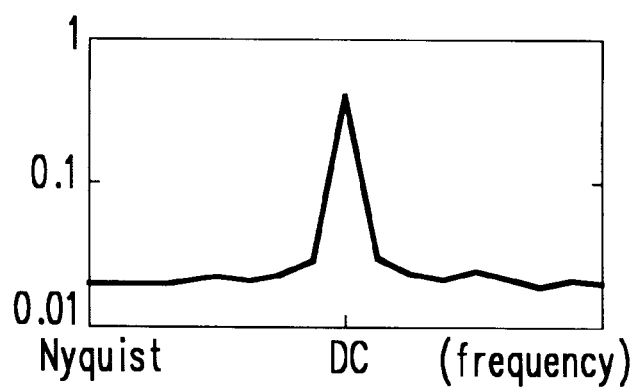
Figure 9C:
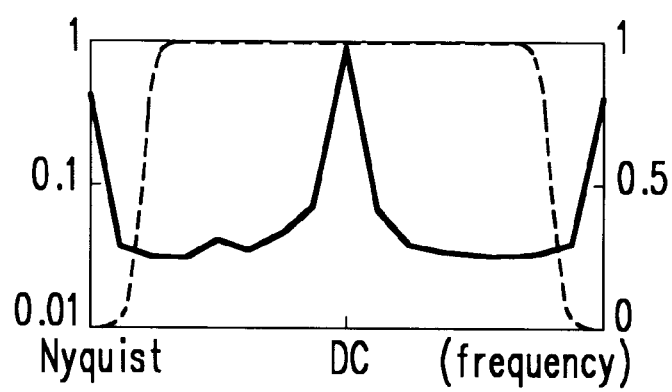

An ROI labeled A (height $FOV_y/2$ along y) containing the heart is shown in FIG. 8a. An aggregate temporal frequency spectrum for region A (obtained by taking the temporal frequency spectrum of the complex signal at each point contained in A, and summing the magnitude of these spectra) is shown in FIG. 9a. The aggregate temporal frequency spectrum for region B (shown in FIG. 8a) is presented in FIG. 9b. As expected, the voxels in the region containing the heart (FIG. 9a) tend to have a wider distribution of frequencies than the voxels located outside the heart (FIG. 9b). In FIG. 8b, the ROIs A and B are overlapped through aliasing. The aggregate temporal frequency spectrum of the resulting (A+B) ROI is shown in FIG. 9c. Aliased and non-aliased components were separated using the Fermi filter plotted in FIG. 9c. This filter was selected automatically from the input data. FIG. 9 is in fact an experimental equivalent to FIG. 6 in the Theory section (with $BW_1=BW_2$). Once aliased and non-aliased components are separated using the filter, images like FIG. 8c can be generated where the aliasing is corrected. In the 'more dynamic' half of FIG. 8c, the SNR was measured to be 0.81 that of FIG. 8a (theoretical value of 0.80 from Eq. 6) while this factor is measured to be 1.54 in the 'less dynamic' area (theoretical value of 1.63).

Figure 8D:
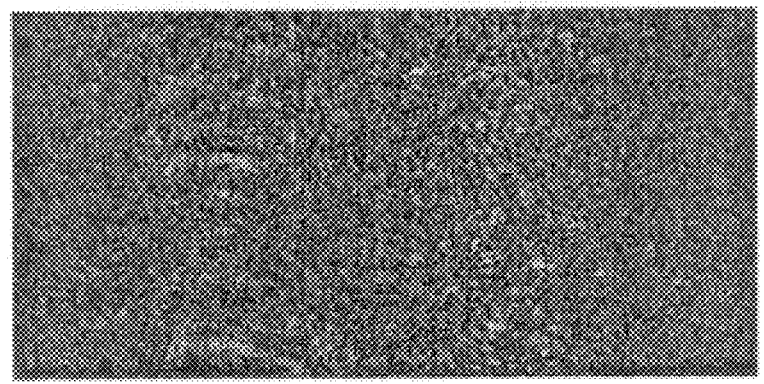
Figure 10:
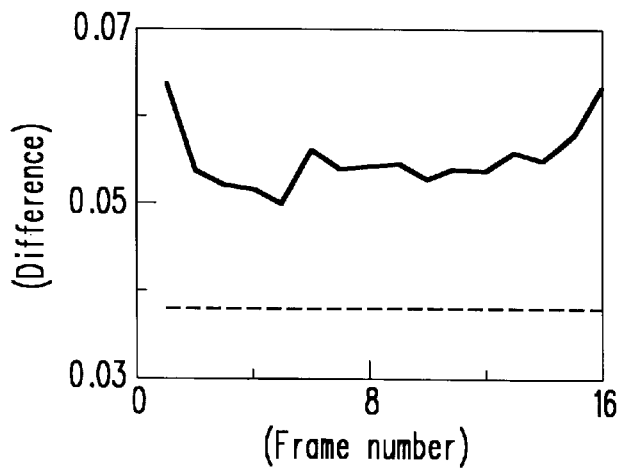
FIG. 10 illustrates the difference between a reference image and an image acquired in accordance with the invention.

FIG. 8d is an evaluation of the quality of UNFOLD's results. It is the absolute value of the difference between the magnitude images in FIG. 8a ('truth') and 8c (result). The windowing is chosen to show clearly the noise level; a given shade of gray corresponds to a magnitude that is ten times lower in FIG. 8d than in 8a–c. Notice that almost no anatomic features can be recognized in the difference image, indicating that UNFOLD successfully corrected the aliasing problem for this time frame. FIG. 10 compares more quantitatively 'truth' and treated images by showing the mean of difference images (like FIG. 8d) over the region containing the heart (ROI A in FIG. 8a) normalized by the mean calculated over ROI A of the 'truth' images (the average is performed over the frame number as well as over the ROI), as a function of the cardiac phase. As seen in FIG. 10, the 'truth' and the treated images differ by roughly 5 to 6% over the region of the heart. This difference comes partly from imperfections in the aliasing removal, and partly from random noise. The dashed straight line in FIG. 10 shows that the level expected due to noise is around 3.8%.

Figure 11:
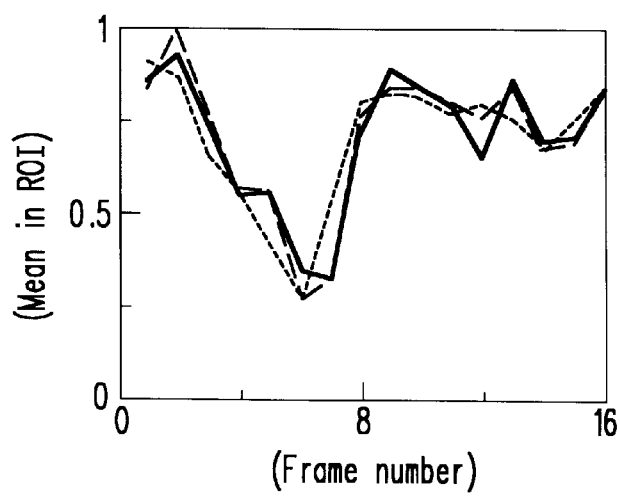
FIGS. 11, 12 illustrate time behavior of reference images and images treated using the present method.
Figure 12:
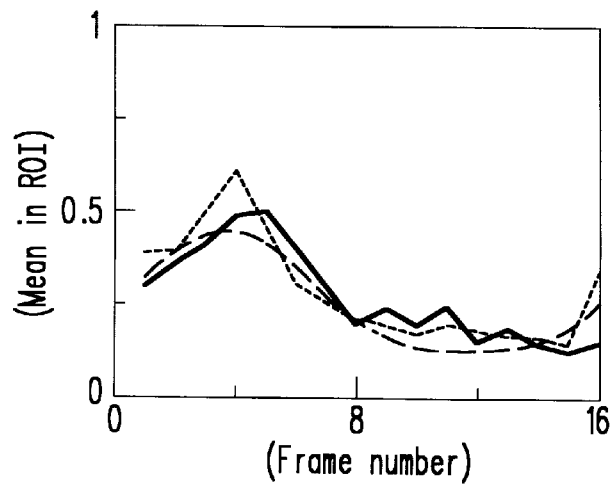

The time behavior of two small ROIs (shown in FIG. 8c) is given in FIG. 11 and FIG. 12. In both cases, the solid and the long-dashed curves represent, respectively, the 'truth' and UNFOLD's output. The short-dashed curve represents images obtained using 'data sharing' to generate sixteen non-aliased time frames from the sixteen aliased frames that were fed into UNFOLD (a pair of time frames is generated by combining a frame made of only the odd $k_y$ lines with each one of its two neighbors, both of which are made of only the even $k_y$ lines). Plots in both figures use the same normalization for the vertical axis. FIG. 11 corresponds to the ROI indicated by the full arrow in FIG. 8c (and FIG. 8b). This ROI has been chosen because wide magnitude variations occur as the myocardium moves in and out of the small ROI, and because a high level of aliasing was present at this location in FIG. 8b. Notice FIG. 11 that solid and dashed curves are very similar, indicating that UNFOLD has been reasonably successful in representing the time behavior of this ROI while using only one half of the acquired data. By comparison, data sharing causes reduced temporal resolution. FIG. 12 gives the time behavior of the intensity for the ROI indicated with the dashed arrow in FIG. 8c. This ROI is adjacent to the descending aorta, and the intensity varies relatively smoothly as the aorta moves in and out of the region. As can be seen in FIG. 8a, the aorta is located within the less dynamic region B and as a result, only a limited temporal bandwidth is available with UNFOLD to describe the time behavior. Accordingly, the method provides only a smoothed representation of the actual variations in the ROI, as can be seen in FIG. 12. In this region, the temporal resolution of UNFOLD is lower than that of data sharing. Perhaps it would be preferred if the aorta would be part of the dynamic region A instead of the less dynamic region B. However, the dynamic region A cannot be larger that $FOV_y/2$ in the phase-encoding direction, which proved insufficient to enclose both the beating heart and the aorta. The solution to this problem would consist in increasing slightly $FOV_y$, such that the aorta can fit, with the heart, into the more dynamic half of $FOV_y$. Unlike UNFOLD, which allows half the FOV to have a higher temporal resolution that the other half, data sharing yields a single, intermediate temporal resolution over the whole FOV. In FIG. 11, the higher temporal resolution in the dynamic region allows UNFOLD to depict the sudden variations more accurately than data sharing. On the other hand, in FIG. 12, the intermediate time resolution of data sharing provides a better representation of the 'truth' than the low temporal resolution of UNFOLD in this region.

An fMRI study was performed using a six interleave spiral imaging sequence [40]. Bilateral finger tapping was performed for 27 seconds, and then stopped for another 27 seconds. Six such paradigm cycles were executed while 78 full FOV images were acquired (13 images per paradigm cycle). FIG. 13a.1 shows one of these 78 images. The temporal frequency spectrum for the voxel indicated by the arrow in FIG. 13a.1 is shown in FIG. 13a.2. Since the expected variations are periodic (with the same period as the paradigm), only the frequencies indicated by a mark on the axis are expected to contain the activation signal. The two arrows in FIG. 13a.2 point to the peaks located at the fundamental frequency of the paradigm; the presence of such peaks indicates that the voxel under consideration is in fact activated by the paradigm. FIG. 13a.4 is the activation map obtained from the 78 acquired images. The motor cortex for both hands (including the pixel considered in FIG. 13a.2) have statistically significant correlation. FIG. 13b.1, c.1 and d.1 show what happens to FIG. 13a.1 as the number of spiral interleaves used in the reconstruction is diminished by a factor n of 2, 3 and 6, respectively. The images are corrupted by aliasing whose severity increases with n. FIG. 13b.2, c.2 and d.2 show the effect of UNFOLD on the temporal frequency spectrum of the voxel highlighted in FIG. 13a.1. The spectrum of FIG. 13b.2 has two components. One is the spectrum of the desired voxel, centered at DC. The second, centered at the Nyquist frequency, contains the contribution from object locations which are aliased onto this same image point. In contrast to the case in FT encoding, this aliased component does not come from a single point in the object. However, it is guaranteed to be zero (except for noise) at DC and, assuming a proper choice of n and $n_t$ was made, it is also zero at the fundamental activation frequency and its harmonics. In general, n spectra are forced to share the same temporal bandwidth. However, none of the peaks in the spectra from the aliased signal fall onto frequencies where activation signal is expected (such frequencies are indicated by a mark on the axis). Accordingly, the aliasing can be removed by zeroing the composite spectrum at the frequencies which do not have a mark on the axis in FIG. 13b.2, c.2 and d.2. The results are shown in FIG. 13b.3, c.3 and d.3, where the aliased components (clearly visible in FIG. 13b.1, c.1 and d.1) have been removed. The activation maps shown in FIG. 13b.4, c.4 and d.4 (to be compared with FIG. 13a.4) confirm that the filtering process preserves most of the activation information while removing the aliased components.

In order to make SNR equivalent comparisons for FIGS. 13a.4, b.4, c.4 and d.4, n time series were averaged in order to recover the SNR that is lost when using only one $n^{th}$ of the spiral interleaves. There are n independent ways of choosing one $n^{th}$ of the interleaves; these were processed separately to yield n sets of images like FIG. 13b.3, c.3 or d.3. These n sets are then averaged before performing the correlation process. This is appropriate in a demonstration of the method's behavior, but would not normally be possible in practice.

UNFOLD can obtain a reduction in acquisition time for individual temporal frames within a dynamic study. UNFOLD was implemented for cardiac triggered imaging and for fMRI. For UNFOLD to be useful in a given application, the geometry and/or time behavior of the imaged anatomy has to meet some criteria. Indeed, there are two important assumptions inherent to the UNFOLD method. It is assumed that more than one spatial point can share a same temporal bandwidth without overlap. Secondly, it is assumed that enough is known about the shape of the spectra in the measured bandwidth such that the contributions from these points can be separated. Limitations of the UNFOLD method are due to the violation of one or both of these assumptions. Such violations give rise to a different kind of aliasing, where some temporal frequencies at a given spatial point are falsely attributed to another spatial point. On the other hand, if these assumptions can be made relatively robust for a given imaging application, UNFOLD can depict accurately the imaged time-varying object while requiring only a fraction of the data that would conventionally be needed. In cardiac imaging and fMRI, these assumptions take the form of seemingly reasonable statements: It should be possible to describe the quasi-static material outside the heart using only a limited bandwidth, and in fMRI, signal should be found only at the temporal frequencies given by the fundamental paradigm frequency and its harmonics.

Figure 14A:
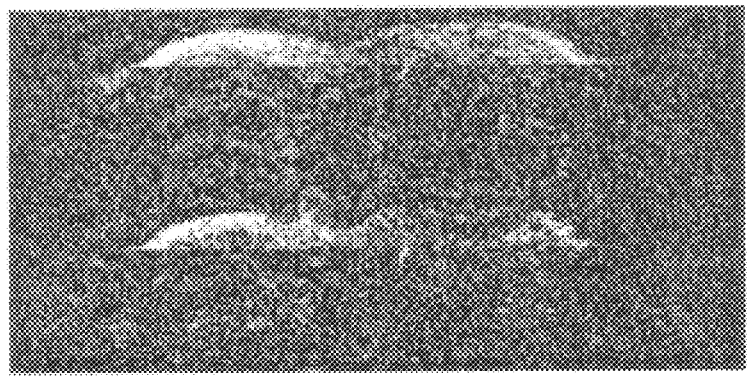
FIGS. 14(a), 14(b) illustrate differences in between reference images and images treated using the present method.
Figure 14B:
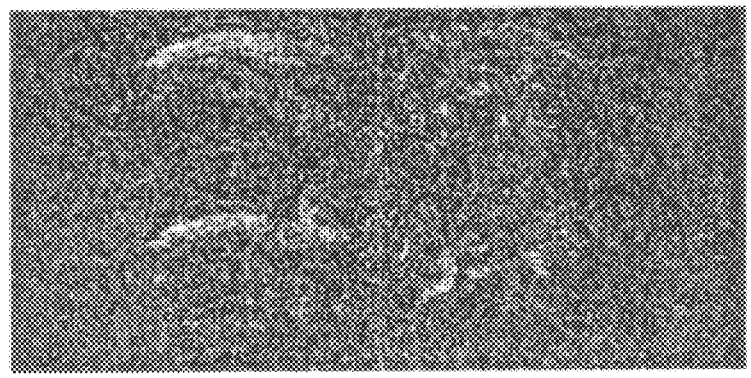

FIG. 14a illustrates a problem that was encountered with the cardiac results presented above. Due to $T_1$ relaxation and eddy currents, the signal magnitude in the first frame of the time series is markedly higher than in the last frame. When the images are displayed in a loop, an effect known as 'lighting flash artifact' occurs at the transition between the end and the beginning of the time series. While UNFOLD assumes the signal in the thoracic wall varies slowly as a function of time, a sudden increase (by roughly 10 to 20%) occurs between last and first frames. Since it belongs to region B (shown in FIG. 8a), the chest wall is represented by UNFOLD using only a limited temporal bandwidth. As a result, a few time frames are required to recover from the sudden change. Although the difference images between 'truth' and UNFOLD's output show almost no anatomic features for intermediate time frames (like FIG. 8d), the same cannot be said for the first and last time frames. FIG. 14a is the difference image for the first frame (same windowing as FIG. 8d); the chest wall can be clearly seen (with a magnitude about 10% of its original value in the 'truth'). With N representing the number of time frames, this problem can be alleviated if the time series is expanded by repeating the frames in reverse order, without repeating the $N^{th}$ nor the $1^{st}$. The ordering of the resulting 2N−2 frames is given by 1, 2, . . . , N−1, N, N−1, . . . , 2. This new time series has no discontinuity, and the need for an alternation of k-space sampling patterns between adjacent frames is respected. Using this "trick", the problem illustrated in FIG. 14a is clearly alleviated, as can be seen by comparing FIG. 14b to FIG. 14a.

The effect of UNFOLD is to reduce the data requirements for the acquisition of a temporal frame. If a time resolution τ is required in a given application, and n spatial points are forced to share the same temporal bandwidth, then an imaging sequence having a duration of about nτ (to obtain a full FOV image) can be used. For example, in fMRI, if a time resolution of 4 seconds is required (about a dozen time points in a ~50 seconds paradigm cycle), an imaging sequence having a duration as long as 24 seconds could be used. The time resolution of the UNFOLD processed images would still be 4 seconds since UNFOLD reduces the acquired FOV in an individual frame by n (6 in this example). Depending on the situation, this decrease by about a factor n in the time required to obtain a temporal frame can be converted into a decrease of the total imaging time, into better spatial and/or temporal resolution, or into larger spatial coverage. This decrease can also allow the use of a slower pulse sequence; for example, one without access to a rapid EPI or spiral imaging sequence could still achieve adequate time resolution in fMRI with a normal 2DFT gradient-echo sequence, if UNFOLD is used to reduce the acquisition time of the temporal frames. Alternatively, a longer TR could be used to increase the BOLD signal-to-noise ratio. The use of UNFOLD to increase the spatial resolution, to increase the number of slices in a multi-slice acquisition, or to decrease the total imaging time is accompanied by a decrease in SNR. However, using UNFOLD to increase the spatial coverage of a 3D scan, the in-plane FOV or the time resolution does not have an adverse effect on SNR (increasing the time resolution would reduce the SNR of the individual frames, but the SNR can be regained by averaging frames if necessary).

What is claimed is:

1. A method for acquiring magnetic resonance images of a dynamic object at multiple time points comprising the steps of:
   a) acquiring k-space information about the object at a first time point and at a first set of k-space locations;
   b) acquiring k-space information about the object at a second time point and at a second set of k-space locations, wherein at least one of the k-space locations in said second set is not contained in said first set;
   c) producing images at said first and second time points using the corresponding k-space data, said images containing spatially aliased and non-aliased components; and
   d) separating said aliased and non-aliased components using a temporal frequency analysis.

2. The method of claim 1 wherein said first and second sets of k-space locations lie on a plurality of lines in k-space, spaced apart along a k-axis.

3. The method of claim 1 wherein step (d) includes a Fourier transform in the time direction.

4. The method of claim 3 wherein step (d) further includes filtering the result of the Fourier transform to separate the aliased and non-aliased components.

5. The method of claim 1 wherein said dynamic object undergoes substantially cyclical variation in its magnetic resonance signals as a function of time, wherein said steps of acquiring k-space information take place over multiple cycles of signal variation, and wherein said time points are points within a representative cycle.

6. The method of claim 5 wherein said dynamic object includes at least a portion of the heart, and wherein said cycle of variation of signals is the cardiac cycle.

7. The method of claim 1 wherein said dynamic object has variations in its magnetic resonance signals in response to a substantially periodic stimulus, resonance imaging (fMRI).

8. A method of acquiring magnetic resonance imaging data from an object by transferring k-space data to a time axis and thereby reducing data acquisition time comprising the steps of:

a) placing an object to be imaged in a static magnetic field ($B_0$), b) applying a magnetic gradient along one axis (z) and an RF signal to excite nuclear spins in a selected plane, c) applying magnetic gradients along at least one of two other axes (x,y) to detect signals from the excited nuclear spins while traversing a path in k-space (kx,ky), d) repeating steps b) and c) to selectively detect signals from the excited nuclear spins while traversing additional paths in k-space to thereby collect a limited amount of data for one time axis point of the moving object, e) repeating steps b), c) and d) for at least one other time axis point of the moving object wherein at least one path in k-space is different from paths in k-space for said one time point; and f) Fourier transforming data as a function of time point collected in steps b, c), d), and e) to obtain data for image point in the selected plane.

9. The method as defined by claim 8 wherein step d) traverses a plurality of lines (kx) in k-space which are spaced apart along a k-axis (ky).

10. The method as defined by claim 9 wherein the object is imaged in response to a substantially periodic stimulus.

11. The method as defined by claim 8 wherein a filter is used in the temporal frequency domain to separate aliased and non-aliased signals.

12. The method as defined by claim 11 wherein the object has cyclical motion, step b) obtaining data for a plurality of time points during the cyclical motion.

13. The method as defined by claim 11 wherein the moving object is a heart.

14. A method of acquiring magnetic resonance imaging data from an object and compressing k-t space for signal detection by increasing the time points at which data is acquired and reducing the number of k-space paths at each time point, thereby using the time axis to encode spatial information and temporal information, said method comprising the steps of a) exciting nuclear spins in a region of interest in an object, b) detecting signals from the nuclear spins along a number of paths in k-space for one time point, c) repeating steps a) and b) for additional time points, wherein at least one path in k-space for another time point is different from paths in k-space for said one time point; and d) Fourier transforming with respect to time the information acquired at the time points to separate signals from multiple spatial locations.

* * * * *